United States Patent [19]

Early et al.

[11] Patent Number: 5,356,662

[45] Date of Patent: Oct. 18, 1994

[54] METHOD FOR REPAIRING AN OPTICAL ELEMENT WHICH INCLUDES A MULTILAYER COATING

[75] Inventors: Kathleen R. Early, Middletown; Donald M. Tennant, Freehold; Warren K. Waskiewicz, Clinton; David L. Windt, Springfield, all of N.J.

[73] Assignee: AT&T Bell Laboratories, Murray Hill, N.J.

[21] Appl. No.: 856

[22] Filed: Jan. 5, 1993

[51] Int. Cl.$^5$ .......................... B32B 35/00; B05D 5/06
[52] U.S. Cl. ..................................... 427/140; 427/165; 427/307; 427/404; 427/554; 427/556
[58] Field of Search ............... 427/141, 165, 160, 162, 427/307, 404, 554, 555, 331; 156/634, 663, 662; 204/192.26, 192.28

[56] References Cited

U.S. PATENT DOCUMENTS

| | | | |
|---|---|---|---|
| 4,129,463 | 12/1978 | Cleland et al. | 148/33 |
| 4,260,451 | 4/1981 | Schmeckenbecher | 156/664 |
| 5,003,567 | 3/1991 | Hawryluk et al. | 378/34 |
| 5,165,954 | 11/1992 | Parker et al. | 427/526 |

OTHER PUBLICATIONS

D. W. Berreman et al., "Soft x-ray projection lithography: printing of 0.2-um features using a 20:1 reduction", Optics Letters, vol. 15, No. 10, May 15, 1990, 529-531.

N. M. Ceglio, et al., "Soft X-Ray Projection Lithography System Design", OSA Proceedings on Soft-X-Ray Projection Lithography, 1991, vol. 12. J. Bokor, ed., Optical Society of America (1991) 5-10 (mo. unavailable).

D. P. Gaines, et al., "Repair of high performance multilayer coatings", SPIE vol. 1547 Multilayer Optics for Advanced X-Ray Applications, (1991) 228-238 (mo. unavailable).

D. L. Windt, et al., "Interface Imperfections in Metal/Si X-Ray Multilayer Structures", O.S.A. Proc. on Soft-X-Ray Projection Lithography 12, (1991) 82-86 (mo. unavailable).

T. A. Shankoff et al., "High Resolution Tungsten Patterning Using Buffered, Mildly Basic Etching Solutions", J. Electrochem. Soc.: Solid-State Science and Technology 122 (1975) 294-298 (mo. unavailable).

*Primary Examiner*—Janyce Bell
*Attorney, Agent, or Firm*—Martin I. Finston

[57] ABSTRACT

The invention in one aspect involves a method for repairing an optical system. The optical system includes at least one optical element which comprises, in turn, a substrate having a principal surface, and a multilayer coating overlying the principal surface. The substrate comprises a first material, and the multilayer coating comprises plural second and at least third material layers in alternation. The method includes the steps of removing the multilayer coating from the substrate, and redepositing a new multilayer coating on the substrate. The old multilayer coating is removed in a single etching step while preserving the quality of the principal surface to such an extent that the peak reflectivity of the new multilayer coating is at least 80% the reflectivity of the old multilayer coating.

In a second aspect, the invention involves a method for repairing an optical system of the kind described above, in which the optical element comprises a substrate having a principal surface, a layer of chromium overlying the principal surface, and a first layer of iridium overlying the chromium layer. The method comprises the steps of removing the first iridium layer from the substrate; and forming a second iridium coating on the substrate. The iridium layer is removed by exposing the iridium and chromium layers to an aqueous solution comprising potassium ferricyanide and sodium hydroxide, resulting in substantial dissolution of the chromium layer.

9 Claims, 2 Drawing Sheets

METHOD FOR REPAIRING AN OPTICAL ELEMENT WHICH INCLUDES A MULTILAYER COATING

FIELD OF THE INVENTION

The invention relates to reflective optical systems for x-rays, such as x-ray lithographic cameras, in which each optical element includes a multilayer interference coating on a highly polished substrate. More particularly, the invention relates to methods for repairing such systems when the multilayer coatings are rejected due to damage or nonconformity to specifications.

ART BACKGROUND

Semiconductor integrated circuits (ICs) are generally made by a sequence of steps including one or more exposures of a photoresist to light through a patterned mask. The diffraction of light imposes limits on the fineness of detail that can be produced by exposures of this kind, and as a result, the density of devices that can be manufactured on a single substrate is limited, in part, by the choice of exposing wavelength. In order to increase the device density, practitioners of IC manufacture have begun developing techniques involving the exposure of special resists to electromagnetic radiation of extremely short wavelengths, such as ultraviolet radiation and x radiation.

In one approach, referred to as proximity print x-ray lithography (PPXRL), hard x rays, having wavelengths of 0.3-5 nm, expose a substrate through a pattern of x-ray absorbing material (such as gold or tungsten) supported on a membrane which is transmissive to the x rays. This method can produce linewidths as small as 20 nm. However, PPXRL has posed significant technical difficulties. In particular, it has been difficult to provide an x-ray source of the required brightness, it has proven difficult to manufacture the masks, and the supporting membranes are generally somewhat fragile.

A second approach to x-ray lithography, referred to as soft x-ray projection lithography (SXPL), is described, e.g., in U.S. Pat. No. 5,003,567, issued on Mar. 26, 1991 to A. M. Hawryluk et al. This approach takes advantage of recent advances in the field of x-ray optics. For example, it is now possible to build an x-ray reduction camera using curved imaging mirrors. These mirrors may be spherical or aspheric. Each mirror includes a substrate of a material such as glass-ceramic or sintered glass having a low coefficient of thermal expansion. The first surface of the substrate is typically ground to high precision and polished. This surface is then overcoated with a multilayer coating, typically a periodic multilayer of material pairs (although groups of more than two alternating materials may be used). The alternating (e.g., paired) materials have a large difference in complex index of refraction at the x-ray wavelength being used. As a consequence of the periodic variation of complex refractive index, the mirror exhibits high x-ray reflectivity at certain angles of incidence. A typical x-ray reduction camera uses a reflective mask consisting of a thin, IC metallization pattern overlying an x-ray-reflective, multilayer coating on a polished (flat or curved) substrate surface. The mask is positioned such that x rays incident thereupon are reflected from the mask onto a primary mirror, from there onto one or more secondary mirrors, and from the last secondary mirror onto a wafer surface coated with an appropriate resist. Image reductions as great as 20:1 have been achieved in this way. (See e.g., D. W. Berreman et al., Opt. Lett. 15 (1990) 529–531.)

The most promising multilayer coated optical elements (i.e., mirrors and masks) include coatings based on metal-silicon bilayers, in which the metal is, for example, molybdenum, rhodium, or ruthenium. These coatings are suitable for use at x-ray wavelengths of 130 Å–300 Å, which, in energy, lie below the silicon L-edge near 125 Å and consequently are relatively weakly attenuated by the silicon layers. For use at even shorter wavelengths, multilayer coatings can be designed to take advantage of the low absorption of other elements such as beryllium, boron, and carbon.

Metal-silicon multilayer coatings are typically deposited by DC magnetron sputtering in argon. For molybdenum-silicon coatings, the total number of bilayers deposited typically ranges from 20 up to about 60, and the bilayer spacing typically ranges from about 68 Å to about 75 Å.

The economic importance of maintaining highly reflective optical elements is discussed in N. M. Ceglio, et al., "Soft X-Ray Projection Lithography System Design", OSA Proceedings on Soft-X-Ray Projection Lithography, 1991, Vol. 12, J. Bokor, ed., Optical Society of America (1991) 5–10. As explained therein, the exposure-limited throughput of a SXPL manufacturing system is very, strongly dependent on the mirror reflectivity. Indeed, a decrease of mirror reflectivity from 70% to 50% could theoretically increase the cost of manufactured wafers by 1000%. However, the reflectivity of multilayer optical elements is expected to decrease over time as a result of environmental damage and aging effects. In order to maintain an adequate throughput, operators of a manufacturing system will have to replace or repair degraded optical elements.

In addition, it may be necessary to strip, i.e., remove, multilayer coatings during or immediately after the original fabrication procedure if, for example, the multilayer coatings have poor morphology, causing low reflectance, or if they have high reflectance but at the wrong wavelength.

Expected replacement costs are very high. This point is discussed, for example, in D. P. Gaines, et al., "Repair of high performance multilayer coatings", SHE Vol. 1547 Multilayer Optics for Advanced X-Ray Applications (1991) 228–238. According to that article, the optical elements of a diffraction limited system operating at 130 Å must maintain less than 10 Å figure error. Moreover, in order to have high peak reflectivity, the surface roughness must generally be less than about 1 Å over spatial wavelengths as short as about 100 Å (for an x-ray wavelength of 140 Å). Fabrication of blanks, particularly curved blanks, to these tolerances is time-consuming and expensive. As a consequence, it is economically attractive to repair optical elements rather than to replace them.

Practitioners in the field of x-ray lithography have, in fact, addressed the problem of repairing multilayer coated optical elements. For example, the above-cited article by D. P. Gaines, et al. describes two repair methods. One is a method of overcoating defective multilayer coatings with new multilayer coatings, and the other is a method of stripping the entire defective multilayer coating by etching an underlying release layer. Of these two methods, the stripping method may be more generally useful, because overcoating will not cure certain defects. These defects include increased surface roughness, departure of a mirror from its required figure, and macroscopic defects such as delamination and cracking. In such cases, the old multilayer coatings must be stripped and replaced. However, the use of an underlying release layer may pose problems, because the time required to remove a multilayer coating by this technique increases rapidly with increasing surface area.

As noted, the stripping method of the above-cited article calls for a release layer to be deposited on the substrate before the reflective multilayer coating is deposited. To be useful in this regard, the release layer must be uniform, it must provide an extremely smooth surface for subsequent deposition thereupon of the multilayer, and it must generally be etchable in an etching solution that is relatively harmless to the substrate. (An etchant is relatively harmless if in the course of ordinary etching times it will not roughen the substrate beyond acceptable tolerances.) Gaines, et al., cited above, reports the use of an aluminum release layer. Aluminum was selected because, according to that article, it can be uniformly deposited and can be etched in, e.g., a solution of hydrochloric acid and cuptic sulphate without measurable damage to the surface finish of a silicon-based substrate. However, aluminum release layers were found to reduce the peak, normal-incidence, x-ray reflectivities of overlying multilayers by a significant amount. This was attributed to surface roughness at spatial wavelengths smaller than 2.5 $\mu$m.

At present, there is no assurance that any material will satisfy all of the requirements for a release layer completely enough to provide a practical method for repairing optical elements. Yet another problem with the use of a release layer is that the process of removing the multilayer coating is relatively time-consuming, as noted above. This is because in order to attack the release layer, the etchant must first penetrate the multilayer coating. Because it is generally dissolved slowly, if at all, by the etchant, the multilayer coating serves as an effective etch barrier which can delay, or even prevent, the dissolution of the release layer.

An alternative method of removing the multilayer coating is to etch it directly. However, this approach has encountered difficulties because at least three different materials are involved. That is, a direct etching process must remove both components (e.g., the metal and silicon components) of the multilayer coating, while maintaining sufficient selectivity to avoid attacking the substrate. In general, etchants able to remove both components in one step have not been found selective enough to avoid damaging the substrate. On the other hand, highly selective etchants have generally been found capable of removing only one component or the other. This makes it necessary to remove the multilayer coating in many, alternating steps, which is undesirable because it is relatively time-consuming. Thus, practitioners in the field have hitherto failed to provide a practical method for directly etching away the multilayer coating.

SUMMARY OF THE INVENTION

We have discovered a practical method for directly etching multilayer coatings in order to remove them from optical elements such as x-ray optical elements. Accordingly, the invention in one aspect is broadly described as a method for repairing an optical system. The optical system includes at least one optical element which comprises, in turn, a substrate having a principal surface, and a multilayer coating overlying the principal surface. Associated with the multilayer coating is a peak reflectivity at a principal wavelength. The substrate comprises a first material, and the multilayer coating comprises plural second and at least third material layers in alternation. With reference to FIG. 5, the method includes the steps of: removing the optical element from the optical system (Step A of the figure); removing the multilayer coating from the substrate (B or E); and redepositing a new multilayer coating on the substrate (I). In contrast to techniques of the prior art, the old multilayer coating is removed in a single etching step while preserving the quality of the principal surface to such an extent that the reflectivity of the new multilayer coating is at least 80% the highest reflectivity ever exhibited by the old multilayer coating.

We have also made the surprising discovery that an aqueous etchant solution comprising potassium ferricyanide and an alkaline hydroxide is effective for removing an iridium layer by attacking an underlying chromium layer. Accordingly, in a second aspect, the invention involves a method for repairing an optical system of the kind described above, in which the optical element comprises a substrate having a principal surface, a layer of chromium overlying the principal surface, and a first layer of iridium overlying the chromium layer. The method comprises the steps of removing the substrate from the optical system; removing the first iridium layer from the substrate; and forming a second iridium coating on the substrate. The iridium layer is removed by exposing the iridium and chromium layers to an aqueous solution comprising potassium ferricyanide and sodium hydroxide, resulting in substantial dissolution of the chromium layer.

DETAILED DESCRIPTION OF SOME PREFERRED EMBODIMENTS

Figure 1:
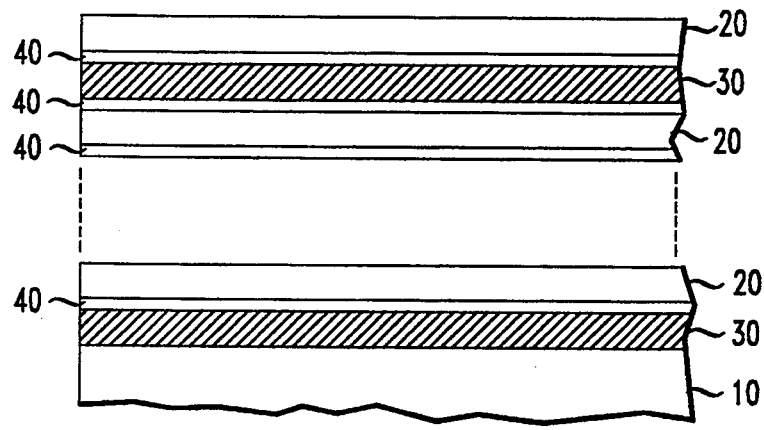
FIG. 1 is a schematic, cross-sectional diagram of a multilayer coating on an x-ray-reflective optical element of the prior art.

With reference to FIG. 1, substrates 10 for the optical elements must be made from a material that can be ground and polished to a given surface figure with the requisite accuracy and smoothness. Typical, projected requirements for x-ray mirrors of at least 10 cm diameter are specified in N. M. Ceglio, et al., cited above. Those requirements call for a total figure-error budget, per mirror, of less than 10 Å, and a surface roughness less than 2 Å rms over an appropriate range of spatial frequencies. Moreover, the substrate material must have a very low coefficient of thermal expansion over the operating temperature range of an optical element in an x-ray imaging system (typically, about 20° C.–30° C.). One currently preferred substrate material is ZERO-DUR ®, a silica-based glass ceramic (heavily doped with other oxides) available from Schott Glaswerke of Mainz, Germany. Pieces of this material can be provided having a thermal expansion coefficient of 0.0 over the temperature range 0° C.–50° C., with an error as small as $\pm 0.02 \times 10^{-6}$/K. An alternate substrate material is the ultra-low expansion glass sold by Corning as ULE ™, Corning Code 7971. This glass is made by flame hydrolysis, and is composed of 92.5% silica and 7.5% titania.

The multilayer coatings of the highest reflectivity that we have so far been able to achieve have been made by alternately depositing molybdenum layers 20 and amorphous silicon layers 30. The deposition method is described in D. L. Windt, et al., "Interface Imperfections in Metal/Si X-Ray Multilayer Structures", *O.S.A. Proc. on Soft-X-Ray Projection Lithography* 12, (1991) 82–86. This method involves DC magnetron sputtering in argon, preferably at an argon pressure of about 0.27 Pa (2 mTorr). It should be noted in this regard that a thin layer 40 of intermediate composition tends to form between the silicon layers and the molybdenum (or other metal) layers. This interlayer adds a further obstacle to the conventional removal of the multilayer coating by multiple-step, selective etching. That is, the interlayer tends to resist etching both by selective etchants for silicon and by selective etchants for molybdenum (or other metals). For example, ethylenediamine pyrocatechol will readily etch silicon at 110° C., but it will not attack molybdenum or the intermediate layers.

Figure 5:
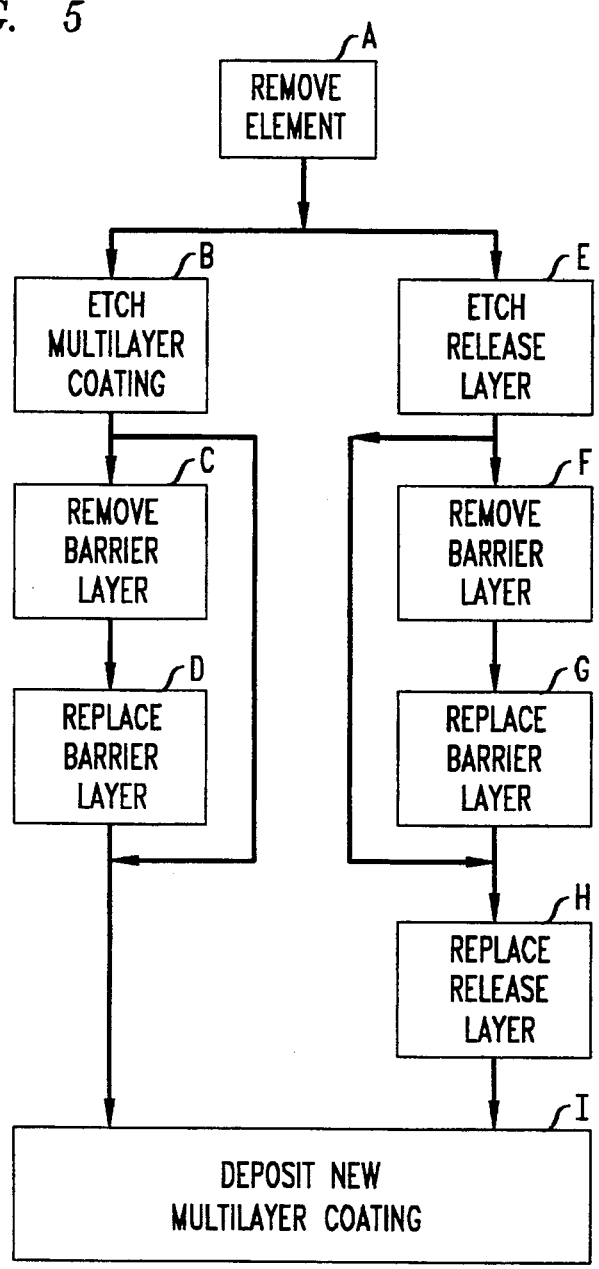
FIG. 5 is a flowchart which illustrates the process steps, in several alternative pathways, for repairing an optical element according to the invention.

We have found an etchant that, quite surprisingly, will remove all of the silicon and molybdenum layers of a multilayer coating in a single etching step (Step B of FIG. 5), while more slowly attacking a silica-based glass substrate. This etchant, known to practitioners in the field of etching as "molybdenum etchant type TFM", and sold by Transene Co., Inc. of Rowley, Mass., is similar to a formulation described in T. A. Shankoff, et al., "High Resolution Tungsten Patterning Using Buffered, Mildly Basic Etching Solutions", *J. Electrochem. Soc.: Solid-State Science and Technology* 122 (1975) 294–298. The etchant is a basic, aqueous solution of potassium ferricyanide. The standard composition is 0.88 molar potassium ferricyanide with 1.0 molar sodium hydroxide. Additives to this composition may be useful. For example, inclusion of a surfactant may facilitate uniform etching. Alkaline hydroxides alternative to sodium hydroxide are also likely to be effective.

This etchant has not, until now, been known as an effective etchant for silicon. Indeed, when conventionally applied at or near room temperature, it will etch silicon, if at all, much more slowly than it etches molybdenum. Surprisingly, we found that when the etchant is heated to about 60° C., it will readily remove silicon-molybdenum multilayer films.

EXAMPLE I

We acquired polished samples of ULE ™ glass from two different suppliers, General Optics Corporation and Tropel Corporation. We believe that these suppliers provided different surface finishes on the glass samples. These samples were directly overcoated (i.e., overcoated without an intervening barrier layer) with silicon-molybdenum multilayer coatings. These multilayer coatings exhibited a peak reflectance at a wavelength in the range 130–145 Å.

The original Tropel ULE multilayer coatings exhibited peak reflectivities of about 52%. These multilayer coatings were then stripped by etching in type TFM etchant for 30 minutes at 60° C., and new multilayer coatings were deposited. The new multilayer coatings exhibited peak reflectivities of 42%–45%.

The original General Optics ULE multilayer exhibited peak reflectivities of 63%–64%. These coatings were stripped for 1.25 hours in type TFM etchant at 60° C., and new multilayer coatings were deposited. Such a new coating exhibited a peak reflectivity of 63%. A substrate having such a new coating was again stripped, for 4.25 hours, and then coated with a third multilayer coating. The third coating exhibited 58% reflectivity.

Each replacement multilayer coating on a substrate provided by General Optics exhibited more than 80% of the reflectivity of the original coating. However, in every case that we observed, the new multilayer coating was, in fact, somewhat less reflective than the old multilayer coating. We attribute this change to an increase in surface roughness of the substrate due to etching. As noted, we believe that the particular surface finish of the substrate affects both the initial reflectivity and the degree to which the reflectivity changes after stripping and recoating.

For the type TFM etchant, an etchant temperature of about 60° C. is preferred because it results in the removal of the multilayer coating in about one hour. Removal is also possible at temperatures as low as about 50° C., although etching will proceed more slowly. The type TFM etchant will not etch the molybdenum-silicon interlayer material at room temperature. It is also possible to etch at temperatures as high as about 80° C. However, it is desirable to protect the substrate from elevated temperatures insofar as possible. That is, substrate materials having extremely low coefficients of thermal expansion generally comprise carefully balanced mixtures of phases. Thermal cycling of the material may change this balance, resulting in an increased thermal expansion coefficient. These changes may be brought about by thermal cycles lying substantially below the melting point, or the glass point, of the material. For example, the thermal expansion coefficient of ZERODUR may be changed by cycling the temperature above 130° C. For this reason, it is often desirable to keep the etchant temperature below 130° C., e.g., at about 100° C. or less, and still more desirable to keep it as close as practicable to room temperature.

In our experimental tests, we have applied the etchant by immersion. However, we believe that alternative application methods, such as vapor exposure, or spraying etchant onto a spinning substrate, may be advantageous because they facilitate uniform exposure to constantly refreshed etchant. It should be noted in this regard that we have observed that agitation increases the etch rate.

Figure 2:
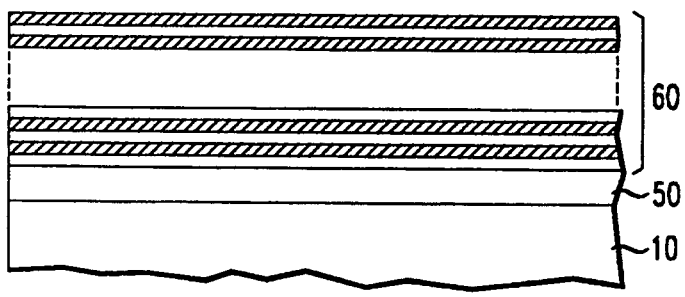
FIG. 2 is a schematic, cross-sectional diagram of a multilayer coating which is underlain by a barrier layer.

With reference to FIG. 2, we have found a second way to remove the multilayer coating in a single step without substantial damage to the substrate surface. This second approach involves an additional layer 50 of material, to be referred to as a "barrier layer", formed intermediate the substrate and the multilayer coating 60. The barrier layer can be deposited, for example, directly on the principal surface of the substrate, and the multilayer coating can then be deposited directly upon the barrier layer. The multilayer coating is etched away in a single step. The presence of the barrier layer relaxes constraints on the one-step etchant. That is, unlike the release layer of the prior art, the material of the barrier layer (i.e., "barrier material") is selected to be relatively resistant to the etchant. As a consequence, the substrate is protected from the etchant, and the etchant need not be harmless to the substrate in the sense described above.

Preferably, the etchant is one that can be used at room temperature, in order to avoid any temperature cycling of the substrate. Mixtures of nitric and hydrofluoric acids ($HF-HNO_3$) constitute a well-known class of room-temperature etchants that will remove silicon, metal components such as molybdenum, and the intermediate compounds that might form between them in interlayer regions. These etchants will also attack silicon dioxide, and are therefore harmful to at least some of the substrate materials presently contemplated. (At low concentrations of HF in nitric acid, i.e., less than about 1 vol. %, but at least about 0.05 vol. %, we have found that silicon dioxide is etched about 30 times more slowly, at room temperature, than the molybdenum-silicon multilayer. At high HF concentrations, less selectivity is expected.) However, materials are available that have the appropriate chemical resistance to serve as barrier materials.

One such material is carbon, deposited, for example, by sputtering, chemical vapor deposition (CVD), or evaporation. We have detected no etching of sputter-deposited carbon films during prolonged exposure to HF:nitric acid etchant, and none during prolonged exposure to type TFM etchant. Preferred thicknesses for carbon barrier layers are in the range 100-1000 Å. The best reflectivities are expected for relatively thin layers, e.g. layers 100-200 Å thick. Moreover, we currently believe that such relatively thin layers will add little stress to the optical element, relative to the stress contributed by the multilayer coating. However, the density of pinholes in the barrier layer can be reduced by making the layer thicker.

After the multilayer coating has been removed by wet etching, the carbon layer is optionally removed (Step C or Step F of FIG. 5) in a dry etching process. To minimize heating of the substrate, it is preferable to use a low temperature plasma etch in, for example, oxygen or ozone. It should be noted in this regard that it is preferable to avoid the use of certain heavy, noble metals such as gold as barrier materials, because gold, for example, tends to form granular layers that lead to excessive surface roughness.

The barrier layer is readily redeposited before depositing a new multilayer coating. (Step D or Step G of FIG. 5.)

EXAMPLE II

Samples of finished ULE glass provided by General Optics Corporation were coated with multilayer coatings as in Example I. Each sample had a 200 Å carbon barrier layer sputter-deposited intermediate the glass surface and a silicon-molybdenum multilayer coating. The original multilayer coatings exhibited reflectivities of about 65%. The multilayer coatings were stripped at 60° C. as in Example I, and redeposited on the original barrier layers. After stripping for 30 minutes, the new multilayer coatings exhibited a peak reflectivity (averaged over two samples) of 65%. The peak reflectivity of a concurrently etched and recoated sample without a barrier layer was 63%. After stripping for 4.25 hours and recoating for a second time, the new multilayer coatings exhibited a peak reflectivity (averaged over two samples) of 63%. The peak reflectivity of the corresponding sample without a barrier layer was 58%.

Another material that we believe appropriate as a barrier material is ruthenium. Ruthenium is relatively insoluble in bases, acids, and even in aqua regia. Our studies of multilayer coatings based on ruthenium-silicon bilayers suggest that a ruthenium barrier layer having adequate surface quality can be made by DC magnetron sputtering in argon. We expect that even a thin layer, i.e., a layer about 100 Å thick, will provide an effective barrier layer against one-step etchants such as $HF-HNO_3$. Because ruthenium is difficult to remove at low temperatures, it may be desirable to use a ruthenium layer as a permanent barrier layer, which is not stripped off (and replaced) prior to deposition of a new multilayer coating.

Other materials will also be appropriate as barrier materials, in at least some cases. By way of illustration, we believe that these materials include iridium, boron, and rhodium.

Figure 3:
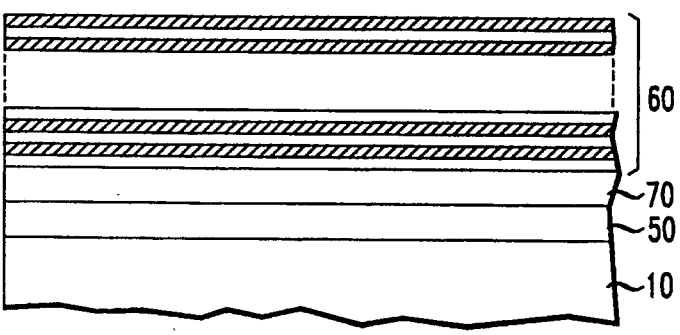
FIG. 3 is a schematic, cross-sectional diagram of a multilayer coating which is underlain by a release layer and a barrier layer.

In accordance with the preceding discussion, the multilayer coating is removed by dissolving it in an etchant. According to an alternate embodiment of the invention described with reference to FIG. 3, the multilayer coating is not removed solely by attacking it directly with the etchant. Instead, a release layer 70 is deposited, preferably intermediate a barrier layer and the multilayer coating. The multilayer coating is removed, typically in a single step, by etching the underlying release layer (Step E of FIG. 5), or by etching both the multilayer coating and the release layer. The release layer is readily redeposited before depositing the new multilayer coating. (Step H of FIG. 5.)

The presence of the release layer relaxes constraints on the material of the multilayer coating, because since it is the release layer, and not the multilayer coating, that needs to be etchable, the material of the multilayer coating can be selected without regard to the feasibility of etching it.

The presence of the barrier layer relaxes constraints on the one-step etchant. That is, because the barrier layer protects the substrate, an etchant can be used that would otherwise attack the substrate. The presence of the barrier layer also relaxes constraints on the material of the release layer, because it is not necessary to select a material that is preferentially etched relative to the substrate.

To accelerate the etching of the release layer, the overlying multilayer coating can be perforated with a pattern of holes. In an illustrative perforation method, a layer of photoresist is lithographically patterned. This patterned layer underlies the multilayer coating and facilitates the lifting off of multilayer coating material to form the perforations. We believe that the performance of an x-ray imaging system will not be unacceptably degraded, in general, if the area of the holes is no more that about 5% of the total area of the multilayer coating. One type of optical element in such a system is a mask, in which reflective regions are distinguished from non-reflective regions by depositing patterned, x-ray-absorptive material over the regions of the multilayer coating that are intended to be nonreflective. In order to optimize the performance of such an element, it will be possible, in at least some cases, to confine the perforations to the non-reflective regions.

We believe that release layers of germanium will be especially useful. A germanium layer is readily deposited, e.g., by evaporation, over a bare silica-based glass substrate or over a carbon barrier layer. A germanium release layer may be useful even without prior deposition of a barrier layer, because germanium is rapidly etched in, e.g., in room-temperature solutions of sodium hydroxide, whereas silicon dioxide is only slowly etched under the same conditions.

Figure 4:
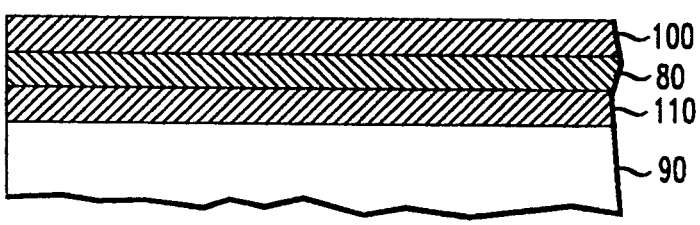
FIG. 4 is a schematic, cross-sectional diagram of a reflective iridium layer which is underlain by a chromium layer and a barrier layer.

One useful material for forming a mirror at wavelengths near 400 Å is iridium. With reference to FIG. 4, we have measured the reflectivities, for example, of 25 cm-diameter optical elements made by depositing an 80 Å layer 80 of chromium on a ZERODUR substrate 90, followed by deposition of a 350 Å layer 100 of iridium. The chromium layer is desirable because it acts as a bonding layer which promotes adhesion of the iridium layer. Quite surprisingly, we have found that the chromium layer is also an effective release layer for stripping of the iridium layer, when exposed to type TFM etchant. We found that the etchant readily penetrated through the iridium layer and attacked the chromium, facilitating removal of the iridium layer. After removing the iridium layer in this way, we deposited a silicon-molybdenum multilayer coating over the stripped substrate. This coating exhibited less x-ray reflectance than was predicted, assuming a pristine substrate. We attribute this result to surface roughening. Surface roughening may be prevented through use of an appropriate barrier layer 110 beneath the chromium layer. It should be noted in this regard that even if surface roughening is unacceptable for applications in x-ray optics, the quality of the stripped substrate surface will be adequate for optical elements operating at longer wavelengths, such as visible wavelengths.

I claim:

1. A method for repairing an optical element having a peak reflectivity at a principal x-ray wavelength, wherein: the optical element comprises a substrate; the substrate comprises a glass or ceramic material; the substrate has a principal surface; the optical element further comprises a first multilayer coating overlying the principal surface; the first multilayer coating comprises plural silicon and molybdenum layers in alternation; and the method comprises the steps of:
   a) dissolving a substantial portion of the first multilayer coating in a single, aqueous, etchant solution that comprises an alkaline hydroxide and potassium ferricyanide, resulting in essentially complete removal of said coating in a single etching step; and then
   b) forming a second multilayer coating on the substrate such that said second coating overlies the principal surface, said second coating having substantially the same composition and structure as the first multilayer coating, said forming step carried out such that the resulting repaired optical element exhibits a peak reflectivity at least 80% of the highest peak reflectivity ever exhibited by the optical element before the dissolving step.

2. The method of claim 1, further comprising, during the dissolving step, the step of maintaining the temperature of the aqueous solution at about 60° C.

3. A method for repairing an optical element having a peak reflectivity at a principal x-ray wavelength, wherein: the optical element comprises a substrate; the substrate comprises a glass or ceramic material; the substrate has a principal surface; the optical element further comprises a first multilayer coating overlying the principal surface; the first multilayer coating comprises plural silicon and metal layers in alternation; the optical element further comprises a barrier layer included between the principal surface and the first multilayer coating, the barrier layer comprising an element selected from the group consisting of carbon, ruthenium, iridium, boron, and rhodium; and the method comprises the steps of:
   a) dissolving a substantial portion of the first multilayer coating in a single, aqueous, etchant solution that comprises hydrofluoric acid and nitric acid, resulting in essentially complete removal of said coating in a single etching step; and then
   b) forming a second multilayer coating on the substrate such that said second coating overlies the principal surface, said second coating having substantially the same composition and structure as the first multilayer coating, said forming step carried out such that the resulting repaired optical element exhibits a peak reflectivity at least 80% of the highest peak reflectivity ever exhibited by the optical element before the dissolving step.

4. A method for repairing art optical element having a peak reflectivity at a principal x-ray wavelength, wherein: the optical element comprises a substrate; the substrate comprises a glass or ceramic material; the substrate has a principal surface; the optical element further comprises a first multilayer coating overlying the principal surface; the first multilayer coating comprises plural silicon and molybdenum layers in alternation; and the method comprises the steps of:
   a) dissolving a substantial portion of the first multilayer coating in a single, aqueous, etchant solution that comprises hydrofluoric acid and nitric acid, resulting in essentially complete removal of said coating in a single etching step; and then
   b) forming a second multilayer coating on the substrate such that said second coating overlies the principal surface, said second coating having substantially the same composition and structure as the first multilayer coating, said forming step carried out such that the resulting repaired optical element exhibits a peak reflectivity at least 80% of the highest peak reflectivity ever exhibited by the optical element before the dissolving step.

5. A method for repairing art optical element having a peak reflectivity at a principal x-ray wavelength, wherein: the optical element comprises a substrate; the substrate comprises a glass or ceramic material; the substrate has a principal surface; the optical element further comprises a first multilayer coating overlying the principal surface; the first multilayer coating comprises plural silicon and metal layers in alternation; the optical element further comprises a first, relatively etch-resistant, barrier layer intermediate the principal surface and the first multilayer coating, the barrier layer comprising an element selected form the group consisting of carbon, ruthenium, iridium, boron: and rhodium; and the method comprises the steps of:
   a) dissolving a substantial portion of the first multilayer coating in a single etchant solution, resulting in essentially complete removal of said coating in a single etching step;
   b) removing the first barrier layer from the substrate;
   c) forming a second barrier layer on the principal surface, said second barrier layer having substantially the same composition and structure as the first barrier layer; and
   d) forming a second multilayer coating overlying the second barrier layer, said second multilayer coating having substantially the same composition and structure as the first multilayer coating, said forming step carried out such that the resulting repaired optical element exhibits a peak reflectivity at least 80% of the highest peak reflectivity ever exhibited by the, optical element before Step (a).

6. The method of claim 5, wherein the barrier layer comprises carbon, and Step (b) comprises exposing the first barrier layer to a low temperature plasma.

7. A method for repairing a reflective optical element comprising: a substrate that comprises a glass or ceramic material and has a principal surface; a layer of chromium overlying the principal surface; and a first layer of iridium overlying the chromium layer, the method comprising the steps of:

a) exposing the iridium and chromium layers to an aqueous solution comprising potassium ferricyanide and an alkaline hydroxide, resulting in substantial dissolution of the chromium layer, leading to removal of the first iridium layer from the substrate; and b) after (a), forming a second iridium layer on the substrate.

8. The method of claim 7, further comprising, before (a), the step of removing the optical element from an optical imaging system.

9. The method of claims 1,2,3, or 5, further comprising, before the dissolving step, the step of removing the optical element from an optical imaging system.

* * * * *